United States Patent [19]
Komiya et al.

[11] Patent Number: 5,904,557
[45] Date of Patent: May 18, 1999

[54] METHOD FOR FORMING MULTILEVEL INTERCONNECTION OF SEMICONDUCTOR DEVICE

[75] Inventors: Takayuki Komiya; Yumiko Kawano, both of Kofu, Japan

[73] Assignee: Tokyo Electron Limited, Tokyo, Japan

[21] Appl. No.: 08/794,936

[22] Filed: Feb. 4, 1997

[30] Foreign Application Priority Data

Feb. 6, 1996 [JP] Japan ................................. 8-044288

[51] Int. Cl.⁶ ........................ H01L 21/28; H01L 21/304
[52] U.S. Cl. ........................ 438/633; 438/641; 438/660; 438/675; 438/688
[58] Field of Search ................................ 438/622, 624, 438/626, 631, 633, 637, 636, 675, 641, 688, 692, 629, 660

[56] References Cited

U.S. PATENT DOCUMENTS

| 5,607,718 | 3/1997 | Sasaki et al. ............................ 427/97 |
| 5,627,345 | 5/1997 | Yamamoto et al. .................... 174/265 |
| 5,655,954 | 8/1997 | Oishi et al. .............................. 451/67 |

FOREIGN PATENT DOCUMENTS

| 5-30052 | 5/1993 | Japan . |
| 7-263589 | 10/1995 | Japan . |
| 8-31456 | 3/1996 | Japan . |

OTHER PUBLICATIONS

Fury, M., "Emerging developments in CMP for semiconductor planarization", Solid State Technology, Apr. 1995, 4 pages.

Krusell, W., et al., "Mechanical brush scrubbing for post-CMP clean", Solid State Technology, Jun. 1995, 4 pages.

*Primary Examiner*—T. N. Quach
*Attorney, Agent, or Firm*—Oblon, Spivak, McClelland, Maier & Neustadt, P.C.

[57] ABSTRACT

A method for forming a multilevel interconnection of a semiconductor device of the present invention includes the steps of forming a first wiring layer by depositing a metallic film containing aluminum on an insulating film of a substrate and patterning the metallic film, forming an interlayer insulating film on the entire surface of the substrate to cover the wiring layer from the upper side, forming a connection hole reaching to the first wiring layer at a predetermined position of the interlayer insulating film, selectively depositing aluminum onto an interior of the connection hole at a volume fraction of 100% or more by CVD to fill the interior of the connection hole, flattening the entire upper surface of the interlayer insulating film including the connection hole filled with aluminum by a polishing process, washing the entire surface flattened by the polishing process, and depositing the metallic film containing aluminum at a predetermined position of the upper surface of the flattened and washed interlayer insulating film and patterning the metallic film, thereby forming a second wiring layer connected to the first wiring layer through aluminum filled in the connection hole.

13 Claims, 3 Drawing Sheets

METHOD FOR FORMING MULTILEVEL INTERCONNECTION OF SEMICONDUCTOR DEVICE

BACKGROUND OF THE INVENTION

The present invention relates to a method for forming a multilevel interconnection of a semiconductor device.

Generally, the circuit structure of the semiconductor device recently intends to have a multilevel (multilayered) interconnection structure in accordance with the need for high density and integration. In the multilayered interconnection structure, a filling technique relating to a contact hole and a via hole is regarded as important to improve an electrical connection between the interconnection and the device or between interconnections. In this case, the contact hole means a connecting portion for connecting a device of a lower layer to an aluminum interconnection of an upper layer. Also, the via hole means a connecting portion for connecting an aluminum interconnection of a lower layer to an aluminum interconnection of an upper layer. For this reason, for example, an aluminum film is formed by sputtering so as to fill the hole with the aluminum film, or a tungsten film is formed by CVD (Chemical Vapor Deposition) so as to fill the hole with the tungsten film.

As a method for filling a connection hole between interconnections, the following three methods have been known.

(Sputtering Method)

An aluminum film is heated at high temperature of 400 to 450° C. or more so as to be formed on a substrate by sputtering, and a hole is filled with the aluminum film. Or, an interior of a processing container is set to be more than one atmospheric pressure. Under this state, the aluminum film is formed on the substrate by sputtering, and the hole is filled with the aluminum film.

(Selective Tungsten Film Forming Method)

By use of such a property that the tungsten film is selectively deposited on a surface of conductive material, the tungsten film is deposited on the surface of the conductive material of a bottom portion of the hole so as to fill the hole.

(Entire Surface Film Formation Etch Back-Method)

$WF_6$ gas is used as process gas, and strong reducing gas, such as $SiH_4$ (monosilane) gas acts on $WF_6$ so as to generate vapor phase reaction. Then, a tungsten film is formed on the entire surface of the substrate, and a hole is filled with the tungsten film. After filling the hole with the tungsten film, an unnecessary tungsten film, which is formed on portions other than the hole, is removed by etch-back.

Among these three methods, the entire surface film formation etch-back method, which is mainly used, will be specially explained with reference to FIGS. 3A to 3E.

FIGS. 3A to 3E show the steps of filling the via hole, which is used to perform the electrical connection between the interconnections, by the entire surface film formation etch-back method. As shown in FIG. 3A, an insulating film 4, made of, e.g., $SiO_2$, is formed on a substrate 2 of a semiconductor wafer. A first wiring layer 6, made of a patterned aluminum film, is formed on the insulating film 4. An antireflection film 8, made of, e.g., a TiN film, is formed on the first wiring layer 6 to carry out a good resist exposure. In the figure, 10 denotes an interlayer insulating film (interlevel insulator), which is made of, e.g., $SiO_2$. The interlayer insulating film covers the entire surface of the upper portion of the substrate 2. In this case, electrical elements (not shown) are also entirely covered with the interlayer insulating film 10.

The via hole 12 is formed to reach the first wiring layer 6 at a predetermined position of the interlayer insulating film 10. If the via hole 12 is filled with the tungsten film and tungsten directly contacts aluminum (first wiring layer 6), contact resistance is increased and adhesion of tungsten and aluminum is deteriorated by an absorbing effect occurred therebetween. In order to avoid such disadvantages, as shown in FIG. 3B, for example, a barrier metal 14, made of a Ti film and/or a TiN film, is formed on the entire surface including an inner surface of the hole 12 before filling the via hole 12 with the tungsten film. Thereafter, as shown in FIG. 3C, for example, a tungsten film 16 is formed on the entire surface of the barrier metal 14 by CVD so as to fill the hole 12. Next, as shown in 3D, an unnecessary portion of the tungsten film 16 and the barrier metal 14 are removed by etch back. As a result, a second patterned wiring layer 18, made of aluminum, is formed on the exposed interlayer insulating film 10 (FIG. 3E). The second wiring layer 18 is electrically connected to the first wiring layer 6 through tungsten filled in the via hole 12.

In the sputtering method, since the sputtering process is performed at a high temperature of 400 to 450° C., it is impossible to use a low constant organic material having low heat resistance as an interlayer insulating film for the next generation. Moreover, in the sputtering method, the TiN film or the Ti film must be used as an underlying film to increase adhesion between the films and to realize good hole filling. Due to this, the number of film forming steps is increased, and the contact resistance becomes higher than the structure in which the Al films are directly connected to each other.

On the other hand, in the selective tungsten film forming method, since tungsten having a specific resistance, which is higher than aluminum, is used, a signal delay occurs and the operation speed of the device is reduced. Due to this, the selective tungsten film forming method cannot sufficiently answer the needs of the device, such as a microprocessor, in which a high speed operation is desired. Moreover, in the selective tungsten film forming method, the upper and lower wiring layers containing aluminum are connected to each other by tungsten, which is a different kind of metal from these layers. Due to this, electromigration and corrosion occur, and reliability of the wirings is reduced. Moreover, if the selective tungsten formation is broken by impurity material adhered to the surface of the conductive material in forming the tungsten film, interwire leakage is induced. In other words, if the selective deposition of the tungsten film on the surface of the conductive material is insufficient, the electrical connection is lost.

Also, in the entire surface film formation etch back method, since the tungsten having a high specific resistance is used, the same problem as the selective tungsten forming method occurs, and the contact resistance generated at the boundary between the films is increased. Moreover, in the entire surface film formation etch back method, the barrier metal 14 must be formed to control the electromigration and to maintain the adhesion. As a result, the number of film forming steps is increased. Then, as compared with the structure in which the Al films are directly connected to each other, the specific resistance is increased. Moreover, the process for forming the tungsten film on the entire surface by CVD is performed at a high temperature of 450° C. Due to this, it is impossible to use a low dielectric constant organic material having low heat resistance as an interlayer insulating film. Moreover, the underlaying film such as barrier metal 14, when being formed, causes tungsten coverage to be lowered due to an increase in an aspect ratio in defining the connection hole. In the worst case, it impossible to fill the connection hole properly.

As mentioned above, if the via hole is filled with the tungsten or the aluminum by sputtering, various problems occur. On the other hand, no problem occurs when the via hole is filled with aluminum by CVD. The reason can be explained as follows.

Aluminum is low in cost, and has low resistance and good conductivity, and the covering property due to CVD is superior to the covering property due to sputtering, so that the generation of voids can be limited.

Therefore, it is desirable that the hole is filled with aluminum by CVD. However, in this case, aluminum is deposited on the hole in a crystal form having a relative large grain size. Due to this, if hole is filled with the aluminum at a volume fraction (occupation rate) of 100% to surely perform the electrical connection between the upper and lower layers, the aluminum rises from the hole, and a convex portion of aluminum is formed on the upper side of the hole. Then, if the wiring processing of the upper layer is further performed as the convex portion is left as it is, the focal depth exceeds its allowable range due to the height of the convex portion in lithography processing. As a result, the lithography processing cannot be carried out with high accuracy.

BRIEF SUMMARY OF THE INVENTION

An object of the present invention is to provide a method for forming a multilevel interconnection of a semiconductor device in which aluminum, which is filled in a connection hole between interconnection by CVD, can be flattened.

The above object can be achieved by the following method for forming a multilevel interconnection of a semiconductor device.

Specifically, according to the present invention, there is provided a method for forming a multilevel interconnection of a semiconductor device comprising the steps of:

forming a wiring layer of a first layer by depositing a metallic film containing aluminum on an insulating film of a substrate and patterning the metallic film;

forming an interlayer insulating film, constituting the first layer, on the entire surface of the substrate to cover the wiring layer from the upper side;

forming a connection hole reaching to the wiring layer of the first layer at a predetermined position of the interlayer insulating film;

selectively depositing aluminum onto an interior of the connection hole at a volume fraction of 100% or more by CVD to fill the interior of the connection hole;

flattening the entire upper surface of the interlayer insulating film including the connection hole filled with aluminum by a polishing process;

washing the entire surface flattened by the polishing process; and depositing the metallic film containing aluminum at a predetermined position of the upper surface of the flatten and washed interlayer insulating film and patterning the metallic film, thereby forming a wiring layer of a second layer connected to the wiring layer of the first layer through aluminum filled in the connection hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

Figure 1:
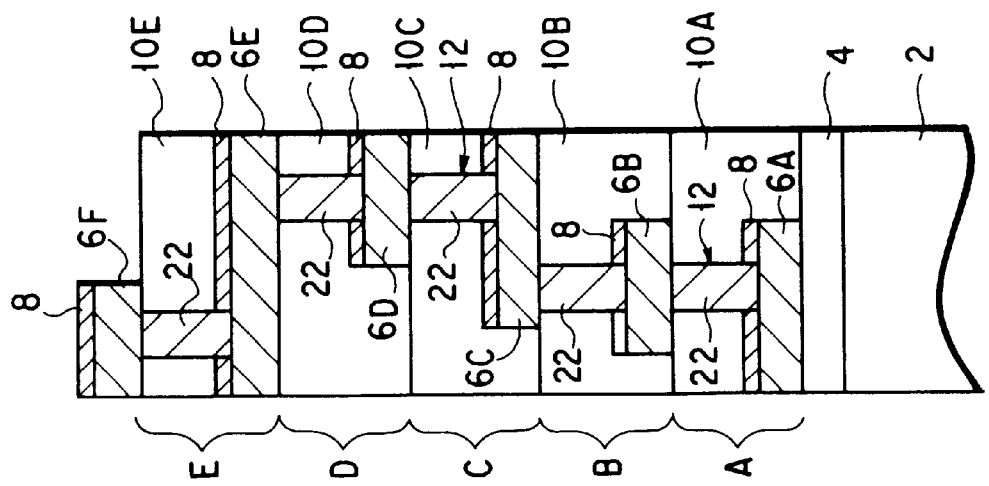
FIG. 1 is an enlarged cross-sectional view showing an example of a multilevel interconnection structure of a semiconductor device formed by a method according to the present invention.

FIG. 1 is an enlarged cross-sectional view showing a multilevel (multilayered) interconnection structure of a semiconductor device formed by a method according to the present invention. As shown in the figure, a semiconductor device 20 is formed to have a multi-layered structure having five layers A to E. A first layer A, which is the lowest layer, is formed on a substrate 2 of a semiconductor wafer, made of e.g., silicon, through an insulating film 4, made of, e.g., $SiO_2$. On the first layer A, second layer B to fifth layer E are layered in order. A large number of semiconductor elements (not shown) are incorporated into each of the layers A to E. To electrically connect the semiconductor elements to each other in each layer, patterned wiring layers 6A to 6E, each containing aluminum, are formed in the respective layers A to E. To electrically insulate between the respective layers A to E, interlayer insulating films (interlevel insulators) 10A to 10E are provided between the respective layers A to E. The interlayer insulating films 10A to 10E are formed of, e.g., $SiO_2$. A patterned wiring layer 6F is formed on the upper end of the fifth layer 5E (uppermost portion of the multilayered interconnection structure). To control the reflection at an exposure and carry out the lithograph processing with high accuracy, an antireflection film 8, which is made of, e.g., Ti (titanium) film or a TiN (titanium nitride) film, is formed on the respective wiring layers 6A to 6E of the layers A to E and the wiring layer 6F of the upper end. To electrically connect the wiring layers 6A to 6F of the adjacent layers A to E to each other, a via hole 12 is formed to pass through each of the interlayer insulating films 10A to 10E and a plug 22 is formed in the via hole 12. The plug 22 is formed by selectively depositing aluminum onto the via hole 12 by CVD.

Next, the following will explain the method for the multilayered interconnection structure of FIG. 1 with reference to FIGS. 2A to 2I.

Figure 2A:
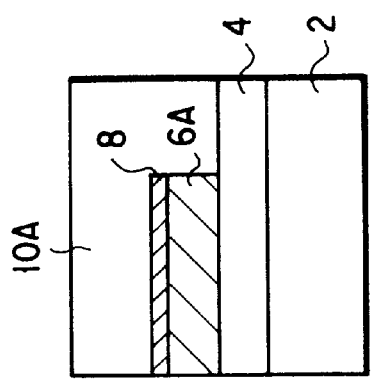
FIG. 2A is a cross-sectional view of the interconnection structure formed by the first step of the multilevel interconnection forming method of the present invention.

First, after forming a large number of semiconductor elements (not shown) on the substrate 2, there is formed a layer film, which is made of a metallic film and the antireflection film 8, by sputtering. The metallic film contains aluminum, and the antireflection film 8 is made of TiN. Then, the layer film is patterned by etching, so that the wiring layer 6A of the first layer A is formed. This state is shown in FIG. 2A. The entire wiring layer 6A is formed of only aluminum. However, slight amounts of elements other than aluminum such as Cu, Si, etc., may be included. The antireflection film 8 is formed to prevent reflected light at an exposure time to carry out an exposure operation accurately. However, in a case where a high degree of accuracy is not required, the antireflection film 8 may not be formed.

Figure 2B:
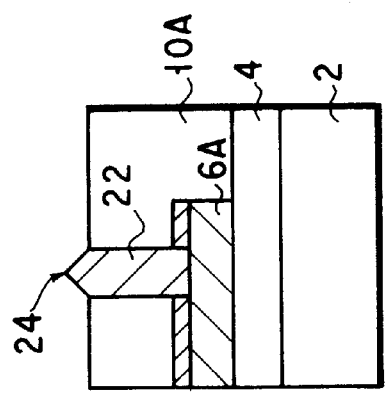
FIG. 2B is a cross-sectional view of the interconnection structure formed by the second step of the multilevel interconnection forming method of the present invention.
Figure 2C:
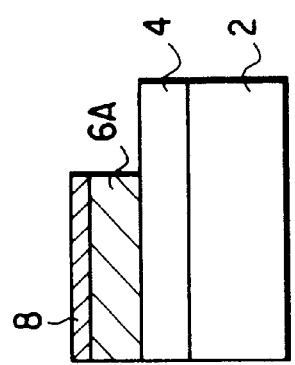
FIG. 2C is a cross-sectional view of the interconnection structure formed by the third step of the multilevel interconnection forming method of the present invention.

After forming the wiring layer 6A, the interlayer insulating film 10A, which is made of, e.g., $SiO_2$, is formed on the entire surface of the substrate 2 by CVD as shown in FIG. 2B. The surface of the interlayer insulating film 10A is polished by CMP (Chemical Mechanical Polishing) so as to be flattened. Thereafter, the via hole 12 is formed at a predetermined position of the interlayer insulating film 10A by a lithography operation to reach the wiring layer 6A. This state is shown in FIG. 2C. In this case, a diameter of the via hole 12 is set to about 0.2 μm. Then, its aspect ratio is set to about 6 to 8 if the device is a DRAM.

Figure 2D:
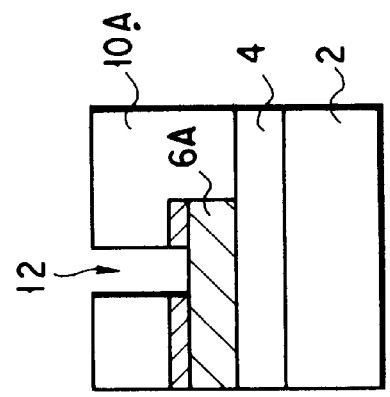
FIG. 2D is a cross-sectional view of the interconnection structure formed by the fourth step of the multilevel interconnection forming method of the present invention.

After the via hole 12 is thus formed, aluminum is selectively deposited onto the via hole 12 by CVD to form the plug 22 in the via hole 12 (FIG. 2D). In this case, the hole 12 is filled with aluminum at a volume fraction (occupation rate) of 100% or more to surely perform the electrical connection between the wiring layer 6A and the wiring layer 6B of the second layer B to be-described later. In the selective CVD for filling the hole 12 with aluminum, for example, DMAH (dimethyl aluminum hydride) is used as a process gas. DMAH exists in a liquid state having extremely high viscosity at normal temperature. Due to this, in order to reduce viscosity, DMAH is heated to be below the decomposition temperature to be sent to a vaporizer. DMAH is vaporized with hydrogen by the vaporizer as to be supplied to the processing container. As is known, DMAH gas undergoes a pyrolysis reaction, and deposits on only the surface of conductive material of high temperature. For this reason, aluminum is selectively deposited on only the via hole 12 where the wiring layer 6A is exposed to its bottom portion. In this case, the process temperature at the filling process is set to about 250° C. at its maximum. If the via hole having a different depth exists, film forming time is set such that all via holes are filled with aluminum at a volume fraction (occupation rate) of 100% or more.

Aluminum is deposited on the hole 12 in a crystal form having a relative large grain size. Due to this, if the hole is filled with aluminum at a volume fraction (occupation rate) of 100%, partial aluminum rises from the via hole 12, and a convex portion 24 of aluminum is formed on the upper side of the via hole 12. The convex portion 24 is projected upward than the upper surface of the interlayer insulating film 10A. Due to this, if the wiring processing of the upper layer (formation of wiring layer 6B of the second layer B) is further performed as the convex portion 24 is left as it is, the focal depth exceeds its allowable range due to the height of the convex portion 24 in the lithograph processing. To cut and remove the convex portion 24, the polishing process is carried out.

Figure 2E:
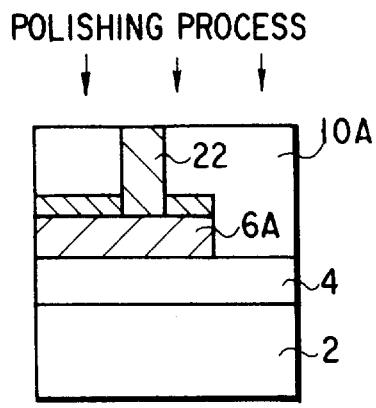
FIG. 2E is a cross-sectional view of the interconnection structure formed by the fifth step of the multilevel interconnection forming method of the present invention.

In the polishing process, the entire upper surface of the first layer A, which contains the via hole 12 having aluminum filled therein, is polished by CMP. As a result, the entire upper surface of the first layer A is flattened. This state is shown in FIG. 2E. In the polishing process using CMP, as polishing liquid consisting of hydrogen peroxide water, there is used slurry (abrasive) containing alumina or colloidal silica as hone grain. Or, there is used slurry containing amine hydrogen peroxide water and no hone grain. At a polishing process time, the rotation speed r of the substrate 2 is desirably set to 30 to 60 rpm, and pad pressure p is desirably set to 2 to 8 psi. The polishing process is, of course, carried by combining slurry with the polishing pad so as to be suitable for aluminum. Specifically, XJFW8099 (trademark name) is used as the slurry, and XHGM1158/SubaIV (trademark name), and Supreme RN-H (trademark name) are used as a polishing pad. In this case, XHGM1158/SubaIV is used at a pre-polishing time, and Supreme RN-H is used at a post-polishing time. The flow rate of slurry is set to 100 to 200 cc/min., and the polishing time is set to 60 to 180 sec. The above conditions shows no more than one example, and the present invention is not, of course, limited to the above conditions.

Figure 2F:
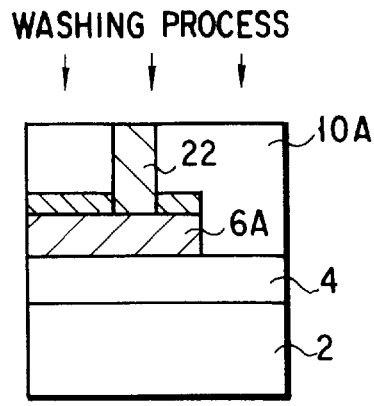
FIG. 2F is a cross-sectional view of the interconnection structure formed by the sixth step of the multilevel interconnection forming method of the present invention.

At the time when the polishing process is ended, the hone grain or polishing waste is left on the flattened polishing surface. To remove the residual, the residual is washed off by a washing process as shown in FIG. 2F. As means for washing off the residual, there can be considered four kinds of methods, such as a water polish washing, a brush washing, a chemical liquid washing, an ultrasound washing. In the washing process, one or two or more methods can be used among these methods.

In the water polish washing, pure wafer is supplied at speed of 100 to 300 cc/min., and the substrate 2 is pressurized by the pad so as to be rotated. In this case, the rotation speed of the substrate 2 is desirably set to 10 to 30 rpm, and the pad pressure p is desirably set to 1 to 4 psi. In the brush washing, pure water is supplied in a state that the substrate 2 is rotated, and the surface of the substrate 2 is cleaned by the brush. In this case, the rotation speed of the substrate 2 is desirably set to 10 to 30 rpm. In the chemical washing, after the substrate 2 is dipped in sulfate hydroxyethyl amine solution having concentration of 0.1M at temperature of 60° C. for 90 seconds, the chemical liquid is washed off. As the chemical liquid, any chemical liquid may be used if the hone grain is dissolved and etching speed of aluminum is low therein. As the chemical liquid, hydrochloric hydroxyethyl amine other than sulfate hydroxyethyl amine can be used. In the chemical liquid process, the amount of etching aluminum differs, depending on the kinds of liquid or the processing conditions, the value is preferably controlled to be 10 nm or less. In the ultrasonic washing process, the substrate 2 is washed ultrasonically in the washing solution whose pH is set to 4 to 7. As explained above, the residual on the upper surface of the substrate can be surely removed by one washing operation or a combination of the above washing operations.

After ending the above washing process, the substrate 2 is heated in a vacuum atmosphere of 150 to 450° C. for about 3 to 60 minutes, so that water adhered onto the surface of the substrate 2 is removed. The reason of, thus, removing water can be explained as follows.

If water is left on the surface of the substrate 2 at a later sputtering time in the high vacuum of the interior of the processing container, water is vaporized little by little. As a result, a predetermined high degree of vacuum cannot be obtained. Regarding this drying process, if water is sufficiently drained in the washing process, it is not always necessary to perform the drying process. However, in order to substantially completely remove water, it is better to perform the drying process.

Figure 2G:
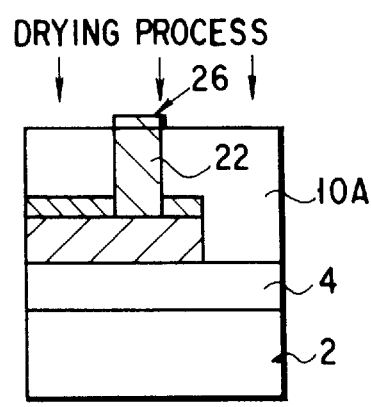
FIG. 2G is a cross-sectional view of the interconnection structure formed by the seventh step of the multilevel interconnection forming method of the present invention.
Figure 2H:
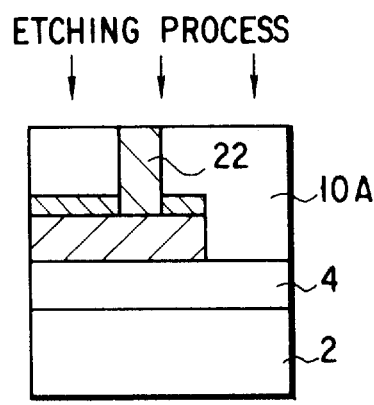
FIG. 2H is a cross-sectional view of the interconnection structure formed by the eighth step of the multilevel interconnection forming method of the present invention.

If the cleaning process or the drying process is performed after the polishing process, a natural oxide film 26, which is caused to increase electrical resistance, is extremely slightly adhered onto the surface of the plug 22, made of aluminum (FIG. 2G). Due to this, it is necessary to perform the etching process for removing the natural oxide film 26. More specifically, the etching process is provided to the substrate 2 by RIE (Reactive Ion Etching) using $BCl_3$ gas as etching gas. As a result, the natural oxide film 26 with which the surface of the plug 22 is coated can be removed (FIG. 2H). In a case where the natural oxide film 26 is extremely slightly adhered to the surface of the plug 22, the etching process may be omitted.

Figure 2I:
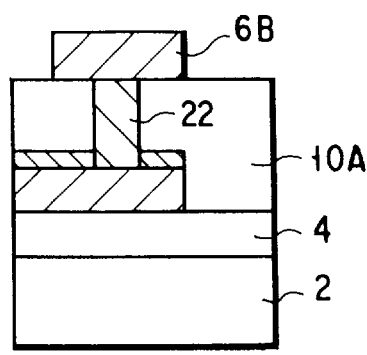
FIG. 2I is a cross-sectional view of the interconnection structure formed by the ninth step of the multilevel interconnection forming method of the present invention.

After the etching process is thus ended, the second layer B is formed by the same method as shown in FIGS. 2A to 2H. More specifically, by sputtering, a metallic film containing aluminum is formed on the entire surface of the upper surface of the first layer A, which is flattened by providing the etching process. The metallic film is patterned by etching, so that the wiring layer B is formed (FIG. 2I). The entire wiring layer B may be formed of only aluminum. However, the wiring layer B may contain slight amounts of elements other than aluminum such as Cu, Si, etc. The wiring layer 6B, is, of course, electrically connected to the wiring layer 6A through aluminum (plug 22) filled in the via hole 12. Also, the wiring layer 6B is electrically connected to the semiconductor element (not shown) of the second layer B.

Thus, the same method as shown in FIGS. 2A to 2H is repeated, so that the five-layered interconnection structure shown in FIG. 1 is formed.

Figure 3A:
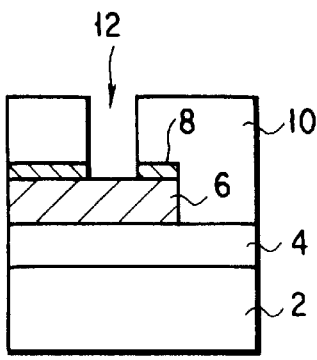
FIG. 3A is a cross-sectional view of the interconnection structure formed by the first step of the conventional multilevel interconnection forming method.
Figure 3B:
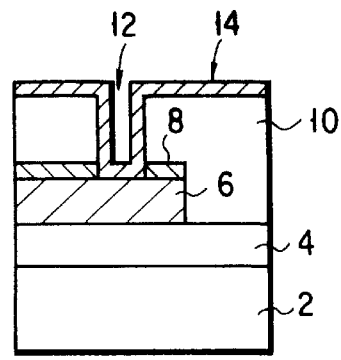
FIG. 3B is a cross-sectional view of the interconnection structure formed by the second step of the conventional multilevel interconnection forming method.
Figure 3C:
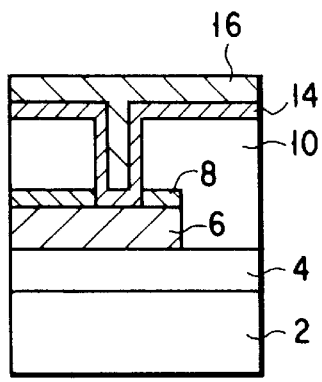
FIG. 3C is a cross-sectional view of the interconnection structure formed by the third step of the conventional multilevel interconnection forming method.
Figure 3D:
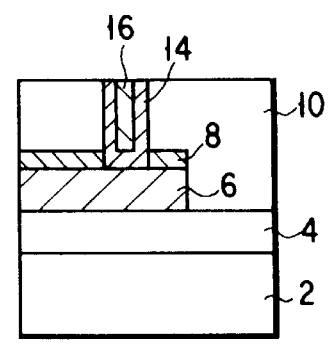
FIG. 3D is a cross-sectional view of the interconnection structure formed by the fourth step of the conventional multilevel interconnection forming method.
Figure 3E:
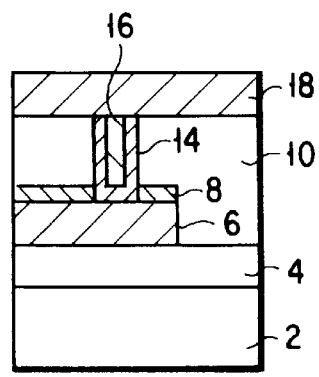
FIG. 3E is a cross-sectional view of the interconnection structure formed by the fifth step of the conventional multilevel interconnection forming method.

According to the above-explained multilayered interconnection forming method of the present invention, the via hole 12 is selectively filled with aluminum by CVD. As a result, there can be formed the Al—Al direct-connection structure in which the upper and lower wiring layers 6A to 6F, made of aluminum, are connected to each other by the same aluminum as the material of the wiring layers 6A to 6F. In other words, aluminum can be directly connected to each other. Therefore, the wiring layers 6A to 6F may not be connected to each other by tungsten whose electrical resistance is higher than Al. That is, this method can answer to the requirements of the device, such as a microprocessor, in which a high speed operation is desired. Also, since no tungsten is used, unlike the conventional case, it is unnecessary to form the barrier metal 14 (FIG. 3B). Moreover, the number of steps can be reduced.

According to the above-explained multilayered interconnection forming method of the present invention, the convex portion 24 of the plug 22, which is generated when the via hole 12 is filled with aluminum, can be flattened by the polishing process. As a result, there is no case in which the focal depth exceeds the allowable range in the photolithograph process for wiring processing. Therefore, fine processing with high accuracy can be performed.

Also, according to the above-explained multilayered interconnection forming method of the present invention, since the antireflection film 8 is formed on each of the wiring layers 6A to 6E, the light reflection at the wiring layers 6A to 6E can be prevented, and the exposure process can be performed with high accuracy.

Moreover, according to the above-explained multilayered interconnection forming method of the present invention, since the drying process is performed after the washing process, water can be substantially completely removed, and the interior of the processing container can be easily set to a high degree of vacuum at the later sputter process time. Also, since the natural oxide film is removed from the plug 22 by etching before the wiring layers 6A to 6E are formed, the electrical resistance between the wiring layers 6A to 6F becomes extremely small.

In the above embodiment, the semiconductor device 20 was formed to have a five-layered structure. However, the present invention is not limited to such a structure. The semiconductor device 20 may be formed to have four or less-layered structure or six or more-layered structure. Moreover, the method of this invention can be applied to not only the case of forming the layers on a silicon substrate but also the case of forming the layers on a glass substrate or an LCD structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method for forming a multilevel interconnection of a semiconductor device comprising the steps of:
    forming a first wiring layer by depositing a metallic film containing aluminum on an insulating film of a substrate and patterning the metallic film;
    forming a first interlayer insulating film over the surface of the substrate to cover said first wiring layer from an upper side;
    forming a first connection hole reaching to the first wiring layer at a predetermined position of said first interlayer insulating film;
    selectively depositing aluminum onto an interior of said first connection hole at a volume fraction of 100% or more by CVD to fill said interior of the first connection hole;

flattening an entire upper surface of the first interlayer insulating film including the connection hole filled with aluminum by a polishing process;

washing the entire surface flattened by said polishing process; and depositing the metallic film containing aluminum at a predetermined position of the upper surface of the flattened and washed first interlayer insulating film and patterning the metallic film, thereby forming a second wiring layer connected to the first wiring layer through aluminum filled in the connection hole;

wherein after washing the entire surface flattened by said polishing process, drying at least one of the first wiring layer and the first interlayer film by heating to remove water left thereon before forming the second wiring layer, and wherein the entire surface flattened by said polishing process is cleaned by at least one of water polish washing, a brush washing, a chemical liquid washing, and an ultrasonic washing.

2. The method according to claim 1, wherein a layer member, having a metallic film containing aluminum and an antireflection film formed on the metallic film, is formed on the insulating film of the substrate, and the layer member is patterned to form the first wiring layer.

3. The method according to claim 1, wherein after water left on the first wiring layer is removed, a natural oxide film, adhered on the upper surface of the aluminum in the first connection hole, is etched to be removed before forming the second wiring layer.

4. The method according to claim 3, comprising:

decreasing an electrical resistance between said first wiring layer and said second wiring layer using said etching.

5. The method according to claim 1, wherein said polishing process is performed by CMP using slurry containing polishing liquid.

6. The method according to claim 1, wherein:

a second interlayer insulating film is formed over the surface of the substrate to cover said second wiring layer from the upper side, after the second wiring layer is formed;

a second connection hole reaching to the second wiring layer is formed at a predetermined position of said second interlayer insulating film;

aluminum is selectively deposited onto the interior of said second connection hole at the volume fraction of 100% or more by CVD to fill said interior of the second connection hole;

the entire upper surface of the second interlayer insulating film, including the second connection hole filled with aluminum, is flattened by the polishing process;

the entire surface flattened by said polishing process is washed;

and the metallic film, containing aluminum, is deposited at a predetermined position of the upper surface of the flattened and washed second interlayer insulating film and is patterned, thereby forming a third wiring layer connected to the second wiring layer through aluminum filled in the second connection hole;

wherein after washing the entire surface flattened by said polishing process, drying at least one of the second wiring layer and second interlayer film by heating to remove water left thereon before forming the third wiring layer, and wherein the entire surface flattened by said polishing process is cleaned by at least one of water polish washing, a brush washing, a chemical liquid washing, and an ultrasonic washing.

7. The method according to claim 6, wherein a layer member, having a metallic film containing aluminum and an antireflection film formed on the metallic film, is formed on the insulating film of the substrate, and the layer member is patterned to form the first wiring layer.

8. The method according to claim 6, wherein after water left on the second wiring layer is removed, a natural oxide film, adhered on the upper surface of the aluminum in the second connection hole, is etched to be removed before forming the third wiring layer.

9. The method according to claim 8, comprising:

decreasing an electrical resistance between said first wiring layer and said second wiring layer, and between said second and third wiring layers using said etching.

10. The method according to claim 6, wherein said polishing process is performed by CMP using slurry containing polishing liquid.

11. The method according to claim 6, wherein all steps described in claim 7 are repeated.

12. The method according to claim 6, comprising:

substantially completely removing said water using said drying;

forming said second and third wiring layers using a high vacuum process after said drying.

13. The method according to claim 1, comprising:

substantially completely removing said water using said drying;

forming said second wiring layer using a high vacuum process after said drying.

* * * * *